United States Patent [19]

Kaplow et al.

[11] 4,283,589
[45] * Aug. 11, 1981

[54] HIGH-INTENSITY, SOLID-STATE SOLAR CELL

[75] Inventors: Roy Kaplow, Newton; Robert I. Frank, Lexington, both of Mass.

[73] Assignee: Massachusetts Institute of Technology, Cambridge, Mass.

[ * ] Notice: The portion of the term of this patent subsequent to Aug. 29, 1995, has been disclaimed.

[21] Appl. No.: 56,259

[22] Filed: Jul. 10, 1979

Related U.S. Application Data

[63] Continuation of Ser. No. 901,331, May 1, 1978, abandoned, which is a continuation-in-part of Ser. No. 689,989, May 26, 1976, Pat. No. 4,110,122.

[51] Int. Cl.³ .................................................. H01L 31/06
[52] U.S. Cl. ......................................... 136/249; 357/30
[58] Field of Search ............... 136/89 MS, 89 SJ, 249; 357/30, 46, 51, 55

[56] References Cited

U.S. PATENT DOCUMENTS

| | | | |
|---|---|---|---|
| 3,422,527 | 1/1969 | Gault | 29/572 |
| 3,653,971 | 4/1972 | Lidorenko et al. | 136/89 |
| 3,948,682 | 4/1976 | Bordina et al. | 136/244 |
| 3,994,012 | 11/1976 | Warner, Jr. | 357/30 |

*Primary Examiner*—Aaron Weisstuch
*Attorney, Agent, or Firm*—Hopgood, Calimafde, Kalil, Blaustein & Judlowe

[57] ABSTRACT

A semiconductor solar cell capable of converting incident radiation to electrical energy at high efficiency includes a plurality of series-connected unit solar cells formed from a common wafer of semiconductor material. The unit solar cells each include a semiconductor substrate of one conductivity type and a p-n junction formed in the substrate. The light-receiving surface of the cell may have an opaque member thereon, and incident light is directed onto the portion of that surface not covered by the opaque member. A variety of embodiments illustrates the invention.

13 Claims, 6 Drawing Figures

HIGH-INTENSITY, SOLID-STATE SOLAR CELL

This application is a continuation application based on our copending continuation in part application Ser. No. 901,331, filed May 1, 1978, now abandoned, which was based on Ser. No. 689,989, filed May 26, 1976, now U.S. Pat. No. 4,110,122, which patent is the subject of Reissue application, Ser. No. 26,754, filed Apr. 3, 1979, and pending.

The present invention relates generally to semiconductor devices, and more particularly, to semiconductor solar or photovoltaic cells.

As the cost of fossil fuels continues to increase, and as the remaining supply of such fuels decreases, an increasing amount of activity is being directed toward achieving ways of obtaining energy from solar radiation. As a significant part of this activity, considerable investigation and research have been performed in attempts to develop semiconductor solar cells that efficiently convert incident radiation, such as sunlight, into electrical energy.

The use of solar cells in practical applications has thus far been limited, primarily as a result of their high cost, and to a lesser extent, because of their relatively low efficiency, and by the relatively low density of the sun's radiation at the earth's surface (in the area of 1000 w/m$^2$), which limits the amount of electrical energy which the known cells are able to generate per unit area of cell. Accordingly, it has generally been believed necessary to interconnect into an array a large number of the known solar cells in order to produce a desirably large electrical output. The need for large quantities of solar cells in a typical installation has caused the costs of such installations to be prohibitively high for widespread application.

In conventional solar cells, the p-n junction is formed parallel to the upper surface of the cell which receives the incident radiation, and a contact grid is formed on that upper surface. In these cells, current flows in the plane of a thin surface region from the contact grid to the base of the cell. In order to avoid series-resistance effects, either a very fine grid geometry or a highly doped surface region or both must be provided in the cell. The conventional cell, even when modified for improved performance at high concentrations of incident light, becomes progressively less efficient at concentrations of over about 50 suns, so that it is not practical to continue to increase the output per unit area of cell by increasing the concentration ratio much beyond about a factor of 50.

Another problem that has been found with the conventional solar cells is that the series connection of these cells may be achieved only by making external connections between individual cells. That is, the conventional cells do not permit the formation of isolated individual solar cells which can be integrally connected to form a single group of a number of groups of series-connected cells on a single wafer of semiconductor material.

One solution that has been proposed to reduce the cost of a solar cell array is to effect greater concentration of collected solar energy upon a reduced area of the solar cells. However, as noted above, the efficiency of conventional cells decreases for incident light substantially beyond concentrations in the order of 50 suns.

The present invention provides a solar cell, as described with respect to several embodiments, in which the exposed surface of the cell is characterized by "active" light-receiving areas separated by conductive members which may be opaque. These cells may be used to advantage with a lens structure that directs or focuses substantially all incident light to fall on at least a portion of the exposed surface of the light-receiving areas of the cell, and the cells are configured for efficient operation over a wide range of radiation intensities, extending well beyond 50 suns; such concentrations may be provided by a collection system as disclosed in our copending application Ser. No. 690,093, filed May 26, 1976 (now U.S. Pat. No. 4,086,485).

A solar cell for use with high-intensity radiation having a vertical p-n junction has been disclosed in a NASA Technical Memorandum entitled "The High Intensity Solar Cell Key To Low Cost Photovoltaic Power" by Bernard L. Sater and Chandra Goradia, and presented at the Eleventh Photovoltaic Specialists Conference sponsored by the IEEE in May, 1975. Other solar cells having vertical p-n junctions are described in U.S. Pat. No. 3,690,953 to Wise, and in an article entitled "Analysis of Vertical Multijunction Solar Cells Using A Distributed Circuit Model" by Pradeep Shah that appeared in *Solid-State Electronics*, 1975 Vol. 18, pp. 1099-1106.

Despite the work that has been done in an attempt to develop solar cells for use with high-intensity light, some of which include the use of vertical p-n junction, the art has thus far failed to develop a practical solar cell of this type which is efficient in use and practical and reliable both in fabrication and in use. For example, the solar cell described in the aforementioned NASA publication is formed from a series of diffused wafers, which are stacked and sliced to form the plurality of vertical p-n junctions. Among other defects associated with this cell is the inability to employ high-temperature surface treatments, such as surface oxide passivation techniques; and the difficulty in obtaining accurate spacing between junctions can be an additional problem in certain applications. Moreover, the known solar cells do not take optimum advantage of the increase in efficiency that can be realized by minimizing the effect of inactive (including opaque) areas of the cell by directing the incident light onto the active (or non-opaque) areas of the cells; nor do the known solar cells take advantage of the property which we discovered in connection with the invention of our U.S. Pat. No. 4,042,417, namely, "Photovoltaic System Including a Lens Structure."

It is, therefore, an object of the invention to provide an improved solar cell that operates efficiently and reliably over a wide range of illumination intensities, including very high intensities.

It is a further object of the invention to provide a solar cell having particular utility when used in conjunction with a means for focusing light onto selected areas of the cell surface.

It is another object of the invention to provide a solar cell generally of the type described which may be fabricated economically.

It is a specific object of the invention to provide in a solar cell a unitary array of unit cells formed from a single wafer substrate and which, when exposed to relatively high concentrations of incident light, will produce relatively large amounts of electrical energy.

It is also a specific object to provide a relatively simple solar cell array construction which can make substantial and effective use of the desired property that substantially all light incident upon the cell shall be within predetermined relatively short carrier travel distance from the nearest junction.

To the accomplishment of the above and to further objects that may hereinafter appear, the present invention relates to an improved solar cell as defined in the appended claims, and as described in the following specification, in conjunction with the accompanying drawings, in which:

The several embodiments of the invention described hereinbelow are all shown as having an n-type silicon substrate. It is to be understood, however, that the solar cell of the invention may also be implemented with a substrate of p-type polarity, in which case the polarity of the other regions in the cell would be reversed, with n replaced by p, n+ replaced by p+, and so on. It will also be understood that other types of semiconductor material may also be employed, and that a heterojunction, as well as the homojunction structure described, may be employed.

Figure 1:
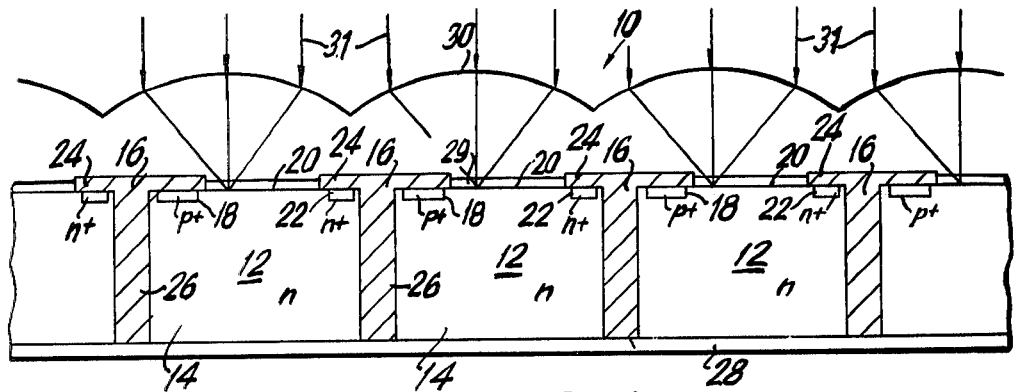
FIG. 1 is a schematic diagram, as viewed in cross-section, of a solar cell according to a first embodiment of the invention.

Turning to the embodiments of the invention described in the drawings, FIG. 1 illustrates a solar-cell arrangement generally designated 10, wwhich is divided into an arrayed plurality of individual or unit solar cells 12, each of which includes an n-type semiconductor substrate 14. The unit solar cells 12 are separated from one another by spaced, parallel stripes 16 of conductive material, which may be advantageously formed of aluminum; stripes 16 are thus opaque, but electrical conductivity rather than opacity is the primary function of stripes 16, as will become clear. A p+-type region 18 is formed in the upper, light-receiving surface 20 of each unit solar cell, near one end of the cell, and forms a p-n junction with the n-type substrate. Also formed in the upper substrate surface at the other end of the cell is an n+ region 22.

Figure 1A:
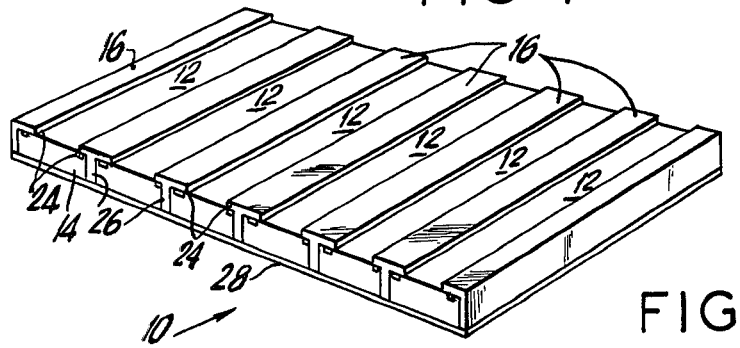
FIG. 1a is a perspective view of a portion of a solar cell as described in FIG. 1.

The stripes 16 extend along the length of each of the unit cells 12; as shown in FIG. 1, each stripe includes at its upper end a conductive upper transverse or flange section 24 which extends over and covers a portion of the upper light-receiving surface 20 of the adjacent unit solar cell 12, thus defining the active area, i.e., the area of the substrate surface that is available for receiving radiation. The same flange sections 24 serve additionally as electrical or ohmic contacts, in that opposed adjacent flanges of adjacent sections 24 overlie and contact the p+ and n+ regions 18-22 of each of the unit solar cells. A vertical portion 26 extends from the aluminum upper flange section and fills the space between adjacent unit solar cells 12; such space will be understood to have been formed as by anisotropic etching, in which case each vertical portion 26 may be a filler in the etched groove. Vertical portions 26 may be of aluminum, or of a semiconductor material, such as polycrystalline silicon, or an insulator such as glass or epoxy; in all cases, however, the flange sections 24 are electrically conductive, for the purposes already indicated. To complete a description of the solar cell, a thin layer of silicon oxide 28 is formed, as by a thermal-oxidation process on the underside of the cell, and an oxide or anti-reflective coating 29 is formed on the exposed, light-receiving or active surface of the substrate. A typical arrangement of the solar cells, as viewed in perspective is shown in FIG. 1a.

Since the use of overlying opaque flange sections 24 has the effect of reducing the active areas available for light energy conversion, the solar cell of the invention is preferably used in conjunction with a light focusing means, such as the lens structure shown schematically at 30. This lens structure focuses the incident sunlight, indicated at 31, on the exposed portion of the substrate surface, that is, the portion thereof not covered by the opaque stripe, and preferably focuses the incident light into a reduced-width band which is incident on the substrate surface at an accurately predetermined distance from the p-n junction of each of the unit cells 12; preferably, the band of focused (concentrated) light is in proximity to the p-n junction region adjacent to that flange section 24 which overlies the region 18, as shown in FIG. 1.

In the solar cell of FIG. 1, the p-n junctions of the individual solar cells 12 are effectively electrically connected in series by means of the conductive arrangement between the overlying conducting flange sections 24 and the location of the p+ and n+ regions.

That is, in the operation of the solar cell of FIG. 1, light incident on surface 20 causes carriers to flow in the substrate across the p-n junction of each unit solar cell. The resulting current flow is across the upper portion of the n-type substrate and to the n+ region 22, and then to the flange section 24 which conducts the current to the p+ region of the adjacent unit solar cell. The conduction of current proceeds in series across the individual solar cells to a current collector (not shown). Assuming identical illumination on each unit cell, the total voltage of an array of series-connected unit cells is equal to the sum of the voltages across all unit cells. The total short-circuit current is equal to the short-circuit current produced by an individual unit cell.

Figure 2:
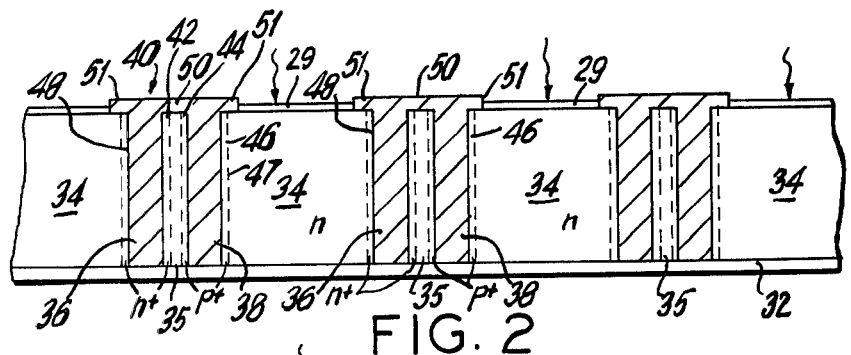
FIG. 2 is a schematic diagram as viewed in cross-section, of a solar cell according to a modification of the embodiment of FIG. 1.

In the embodiment of the invention illustrated in FIG. 2, the unit solar cells 34 are separated by an intermediate portion of semiconductor material 35 which is provided between adjacent vertical portions 36 and 38 of a π-shaped member 40 which separates the single n-type silicon wafer into a plurality of individual solar cells. The intermediate sections 35 are each of n-type conductivity and include an n+ region 42 along one side and in contact with one vertical conductive portion 36, and a p+ region 44 along another side and in contact with the other conductive portion 38.

The vertical portions 36, 38 separating the individual solar cells are interconnected by a bridge section 50 made preferably of aluminum, which as in the embodiment of FIG. 1, has transverse or flange sections 51 that extend transversely over the upper surfaces of each of the adjacent solar cells. The vertical portions 36–38 may be either of the same conductive material as the bridge section, or can be of an insulator, such as glass or epoxy, a semiconductor such as polycrystalline silicon, or a metal other than aluminum. Opposing flange sections 51 of each of the conductive channels respectively overlie and establish electrical contact with the p+ region 46 and n+ region 48 of each solar cell. As in the embodiment of FIG. 1, the lower surface of the solar cell that is opposed to the light-receiving upper surface is coated with an oxide layer 32. Although radiation is shown in FIG. 2 as being directly incident on the surface of the solar cells, a lens arrangement such as that shown in FIG. 1, may be advantageously employed with the solar cell structure of FIG. 2.

In operation of the embodiment of FIG. 2, the current flow induced in the solar cells by the incident radiation flows from the vertical p-n junction 47 across the upper portion of the substrate to the n+ region 48 and then to the conductive flange section 51, over the bridge section 50, to the next conductive flange section 51, and then to the p+ region 46 of the adjacent solar cell.

Figure 3:
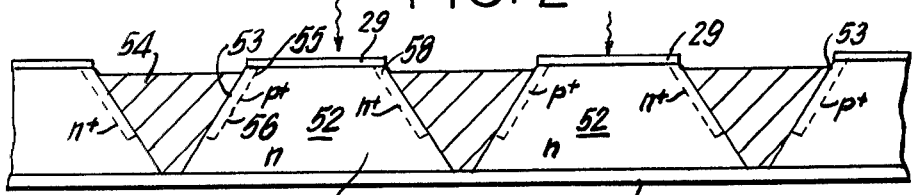
FIG. 3 is a schematic diagram, as viewed in cross-section, of a solar cell according to a second embodiment of the invention.

In the embodiment of the invention illustrated in FIG. 3, the solar cells 52 are trapezoidal as viewed in cross-section and are separated by wedge-shaped cutouts 53, formed as by anisotropic etching. These cutouts may, as shown, be filled with a conductive material 54, such as aluminum. A p+ region 55 forming a slanted p-n junction 56 with the n-type substrate 57 is formed along part of one wall of the solar cell in electrical contact with the aluminum conductive material. An n+ region 58 is formed in part of the opposing wall of the solar cell and is in electrical contact with the aluminum conductive material in the adjacent cutout. The bottom surface of the solar cell opposed to the radiation-receiving surface may be, as before, an oxide film, designated 32.

In the operation of the solar cell of FIG. 3, current flows across the p-n junction to the n+ region and through the aluminum conductive material, and from there to the next adjacent solar cell. Since the area of the upper radiation-receiving upper surface is relatively small, as compared to the bottom surface, a light-focusing system, such as that shown in FIG. 1, may be used to advantage in the embodiment of FIG. 3.

Figure 4:
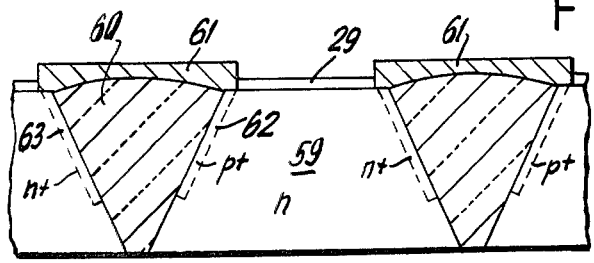
FIG. 4 is a schematic diagram, as viewed in cross-section, of a solar cell according to a third embodiment of the invention.

The solar cell illustrated in FIG. 4 is similar to that of FIG. 3, in that the unit cells 59 are trapezoidal in cross-section and are separated from one another by wedge-shaped grooves. In the embodiment of FIG. 4, those grooves are filled with an insulation material 60, such as glass or epoxy. Each section of insulation material 60 is covered with a metal layer 61 which extends over material 60 and electrically contacts the p+ regions 62 and n+ regions 63 of adjacent solar cells to achieve series-connection between adjacent cells.

The walls of the grooves in the solar cell of FIG. 4 may also be oxidized to form a silicon oxide coating on the walls, and thereafter the groove may be filled with a metal or a semi-conductor material. The oxidized grooves may also be filled with polycrystalline silicon, which has the advantage of having a coefficient of thermal expansion that is close to that of the silicon substrate.

Figure 5:
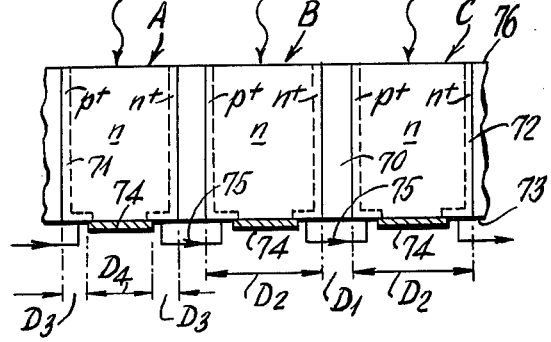
FIG. 5 is a schematic diagram, as viewed in cross-section, of a solar cell according to a fourth embodiment of the invention.

In the embodiment of FIG. 5, the multiple cell units A-B-C are all formed from the same single original wafer substrate, as of silicon, designated as of first conductivity type n. The grooves or slots 70 by which adjacent cell units are spaced are of width $D_1$ which may be relatively small compared to the width $D_2$ of each individual cell unit. For each unit, the opposed parallel side walls are of different conductivity type, the left-hand walls 71 being shown by legend p+ to be of second conductivity type, and the right-hand walls 72 being shown by legend n+ to be of first conductivity type, with greater impurity concentration locally diffused therein. The p+ and n+ regions extend the full area of the respective sidewalls 71-72 and also laterally inward to the relatively short extent $D_3$, along the back or bottom surface 73 of each unit, thus leaving an ample clearance $D_4$ between the p+ and n+ regions of each cell unit. A protective oxide coating 74 in slight overlap with adjacent bottom-surface p+ and n+ regions assures external integrity of the electrically insulated relation between p+ and n+ regions of each cell unit. Series electrical interconnection of successive cell units may be via conductive filling of slots 70 or, as schematically suggested in FIG. 5, separate series-interconnects 75 may provide necessary ohmic contact with bottom-exposed adjacent p+ and n+ regions of successive adjacent cell units of the array. Such construction will be seen to enable slots 70 to remain open, i.e., unfilled, as may be desired for certain cooling configurations, for example, as discussed at greater length in our application Ser. No. 889,952, filed Mar. 24, 1978 (now U.S. Pat. No. 4,193,081); in spite of the open condition shown for slots 70, means for holding the fixed positional relation of adjacent cell units to each other will be understood to be schematically indicated by solid-line connections (across slots 70) at the upper and lower surface levels 73-76.

The particular method of making the described structures from a single substrate wafer and for assuring relatively positioned fidelity of the separate cell units formed from the single substrate, may be one of several presented in our copending application Ser. No. 796,657, filed May 13, 1977 (now U.S. Pat. No. 4,131,984), and therefore, no further description need now be given as to manufacture. For the form of FIG. 5, however, it is observed that satisfactory techniques are described in copending application Ser. No. 877,356, filed Feb. 13, 1978 (now U.S. Pat. No. 4,129,458); specifically, after first etching the grooves or slots 70, and masking upper and lower cell surfaces with oxide as appropriate, both opposed walls 71-72 at each groove 70 are subjected to p+ diffusion, whereupon the walls 72 are etched away to bare silicon, and an n+ diffusion is performed.

Based on our findings which are stated more explicitly in our U.S. Pat. No. 4,042,417, the effective width of the upper or exposure surface 76 of each cell unit is in the range up to 10 mils and is preferably in the order of 1 to 4 mils; and the p+ diffusion depth at any given sidewall surface is relatively shallow, as to the extent of 0.1 mil, or as little as 0.01 mil if the local surface in which the diffusion is made is metal-clad. Further, if the groove width $D_1$ is constructed larger than the order of one mil, suggested by the $D_1:D_2$ proportions shown, then a cylindrical-lens array as suggested at 10 may be readily accommodated by each of the described forms, to make use of all incident light (including highly concentrated light impinging upon the cylindrical lens array). On the other hand, if the groove width $D_1$ is relatively narrow, as in the order of 0.1 mil, then the cylindrical lens array may be dispensed with and the cell array may function directly and efficiently upon exposure to collected sunlight which has been highly concentrated, in the order of 50 or more suns, prior to direct inpingement upon the exposure surfaces 76 of all units of the cell array.

The solar cell of the invention, particularly in the embodiments of FIGS. 1 to 4, is characterized in that no current flows along or within the plane of the diffused region; this point is particularly significant in case of highly concentrated incident radiation. In the embodiment of FIG. 5, there is a limited amount of current flow in the exposed portion of the diffused region, which, however, is coextensive with the sidewalls, thereby reducing the resistivity of the diffused region, as compared to the relatively shallow diffusion regions that are required in conventional solar cells. And, as noted, in these embodiments, the distances that the carriers travel in the diffused regions are relatively small, thus further reducing the resistance due to current flow in these regions.

We consider it important to the successful practice of our invention that all cell units which are severed (e.g. by etching) from the single original substrate wafer shall retain in their ultimately arrayed configuration the same body relation to each other as was the case prior to being severed. By maintaining this relation, not only is manufacture facilitated for the microscale dimensional proportions given above, but micro-electronic fabrication techniques are directly applicable to materially increase the uniformity with which all junctions and interconnects are formed for a given array. Thus, the described configurations, for the dimensional scale given above, have high probability of uniformity, so that the described series-connected arrays will not be characterized by local bottle-necking resistance to current flow at any particular one of the many series connected units of the array.

For the particular silicon-base material employed in our experiments, the optimum area in which to receive all or substantially all incident light is 1 to 2 mils from the nearby p-n junction, but an important and substantial collection of carriers is achieved in this substrate material for light incident at each surface 76 within the range of 3.0 mils from the p-n junction plane. It should be understood that the optimum or an acceptable range of offset from the p-n junction plane (and, thus, also the optimum unit-cell width) is dependent inter alia on the minority-carrier diffusion length of the base material. A base material having different minority-carrier diffusion lengths would change this distance accordingly, as would processing the base material to improve the carrier-diffusion length. Generally speaking, it is desirable that the maximum distance that carriers must travel to reach and be collected at the p-n junction shall be less than the minority-carrier diffusion length. For the sample used in connection with the graphical reporting in said U.S. Pat. No. 4,042,217, the diffusion length (including surface recombination effects) was in the order of 2 mils.

Although the foregoing discussion of the various embodiments of the invention has been in the context of radiation exposure from one side of the array, and impliedly to the exclusion of radiation exposure from the other side of the array, it will be appreciated that reversability of surface exposure to radiation (with accompanying reversal of unexposed surface used for electrical interconnection of unit cells) may apply for each of the basic embodiments. Reversability of exposure can also be accomplished for the embodiments of FIGS. 1 to 4, without changing electrical interconnections, because the electrical connections are inherent in the structures of these embodiments.

It will also be appreciated that whereas the solar cell of the invention has been specifically described hereinabove with respect to several embodiments, modifications may be made therein by those skilled in the art without necessarily departing from the spirit and scope of the invention.

What is claimed is:

1. A semiconductor solar cell, comprising a substrate body of a first conductivity type and having spaced parallel exposure-side and underside body surfaces, one of said surfaces having a plurality of laterally spaced elongate grooves with opposed inclined sidewalls which diverge in the direction of said one surface, thereby defining plural spaced, elongate, parallel units with sidewalls which converge in the direction of said one surface, the maximum effective lateral width of the exposure side of each unit being within the range up to ten mils, one sidewall of each unit comprised of a localized region of a second conductivity type, said localized region being diffused into said one sidewall and defining with adjacent first conductivity type body material a photovoltaic junction plane which is parallel to the sidewall surface at said region, the other sidewall of each unit being of first conductivity type, and electric-circuit connection means including first conductive means having ohmic contact with said second conductivity-type regions and second conductive means having ohmic contact with regions of said first conductivity type.

2. The solar cell of claim 1, in which said grooves extend to said other body surface, whereby said units have minimum separation at said other surface, and means fixedly retaining said separation of adjacent units.

3. The solar cell of claim 2, in which said substrate is of silicon-base material and the effective width of each unit at the exposure surface is in the order of 1 to 4 mils.

4. A semiconductor solar cell, comprising a substrate body of a first conductivity type and having spaced parallel exposure-side and underside body surfaces, one of said surfaces having a plurality of laterally spaced elongate grooves with opposed inclined sidewalls which diverge in the direction of said one surface, thereby defining plural spaced, elongate, parallel units with sidewalls which converge in the direction of said one surface, the maximum effective lateral width of the exposure side of each unit being within the range up to ten mils, one sidewall of each unit comprised of a localized region of a second conductivity type, said localized region being diffused into said one sidewall and defining with adjacent first conductivity type body material a photovoltaic junction plane which is parallel to the sidewall surface at said region, the other sidewall of each unit comprised of a localized region characterized by higher impurity concentration of first conductivity-type material, said impurity region being diffused into said other sidewall, and means interconnecting said units for combining the individual electrical outputs of said units, said means comprising separate conductive connections establishing ohmic contact with the respective sidewall regions of said units.

5. A semiconductor solar cell comprising an essentially flat, thin array of plural, spaced, elongate parallel semiconductor units formed from a common substrate wafer having spaced parallel exposure-side and underside body surfaces and comprised of a first conductivity type, the body material of each of said units having the same spaced retained relation to the body material of other of said units as in the original substrate from which they are formed, each unit having spaced elongate upstanding sidewalls extending between exposure-side and underside body surfaces, the maximum effective lateral width of the exposure side of each unit being within the range up to 10 mils, one sidewall of each unit comprised of a localized region of a second conductivity type which localized region also extends to a limited extent contiguously along a region of the adjacent underside body surface of said each unit, said localized region being diffused into said one sidewall and defining with adjacent first conductivity type body material a photovoltaic junction plane which is parallel to the sidewall surface at said region, the other sidewall of each unit comprised of a localized region characterized by higher impurity concentration of first conductivity-type material which localized region also extends to a limited extent contiguously along a region of the adjacent underside body surface of said each unit but short of contact with the adjacent second conductivity-type region of said each unit, said impurity region being diffused into said other sidewall, and means interconnecting said units for combining the individual electrical outputs of said units, said means comprising separate conductive connections to the respective sidewall regions of said units solely via ohmic contact with said associated underside body regions.

6. The solar cell of claim 5, in which the spaces between adjacent sidewalls of adjacent units are unfilled.

7. A semiconductor solar cell, comprising a substrate body wafer of a first conductivity type and having spaced parallel exposure-side and underside body surfaces, one of said surfaces having a plurality of laterally spaced elongate grooves with opposed upstanding sidewalls which extend to said one surface, thereby defining plural, spaced, elongate, parallel units with sidewalls extending from one to the other of said surfaces, the maximum effective lateral width of the exposure side of each unit being within the range up to ten mils, one sidewall of each unit comprised of a localized region of a second conductivity type, said localized region being diffused into said one sidewall and defining with adjacent first conductivity type body material a photovoltaic junction plane which is parallel to the sidewall surface at said region, the other sidewall of each unit comprised of a localized region characterized by higher impurity concentration of first conductivity-type material, said impurity region being diffused into said other sidewall, means interconnecting said units for combining the individual electrical outputs of said units, said means comprising separate conductive connections establishing ohmic contact with the respective sidewall regions of said units, and means external to said grooves for fixedly retaining the groove-separated distance between adjacent units.

8. The solar cell of claim 7, in which each of the grooves between adjacent units is filled with solid material.

9. The solar cell of claim 8, in which said solid material is of metal.

10. The solar cell of claim 8, in which said solid material is electrically insulating.

11. The solar cell of claim 7, in which said grooves are unfilled.

12. The solar cell of claim 7, in which said sidewalls are substantially parallel.

13. The solar cell of claim 7, in which for each groove said sidewalls are divergent in the direction of said one body surface.

* * * * *